United States Patent [19]

Heremans et al.

[11] Patent Number: 5,314,547
[45] Date of Patent: May 24, 1994

[54] RARE EARTH SLAB DOPING OF GROUP III-V COMPOUNDS

[75] Inventors: Joseph P. Heremans, Troy; Dale L. Partin, Romeo; Christopher M. Thrush, Shelby Township, all of Mich.

[73] Assignee: General Motors Corporation, Detroit, Mich.

[21] Appl. No.: 951,995

[22] Filed: Sep. 28, 1992

[51] Int. Cl.$^5$ ............................................. H01L 29/00
[52] U.S. Cl. ................................... 148/33.1; 148/33.4; 148/33.6; 148/300; 148/301; 338/32 R; 338/32 S; 338/32 H
[58] Field of Search .............. 148/33.1, 33.4, 33.6, 148/300, 301; 372/44; 338/32 R, 32 H, 32 S

[56] References Cited

U.S. PATENT DOCUMENTS

| | | | |
|---|---|---|---|
| 4,577,322 | 3/1986 | Partin | 372/44 |
| 4,608,694 | 8/1986 | Partin | 372/44 |
| 4,612,644 | 9/1987 | Partin | 372/44 |
| 4,684,805 | 8/1987 | Lee et al. | 250/343 |
| 4,722,087 | 1/1988 | Partin | 372/44 |
| 4,747,108 | 5/1988 | Partin et al. | 372/44 |
| 4,847,666 | 7/1989 | Heremans et al. | 357/16 |
| 5,173,127 | 12/1992 | Shimakura et al. | 148/33.6 |

OTHER PUBLICATIONS

Heremans et al. "Erbium doping of Molecular Beam Epitaxy grown ImSb on InP", J. Vac. Sci. Tech. Bio(2), 1992, 659–663 month unknown.
Partin et al. "Samarium doping of Molecular Beam Epitaxially grown InSbonImP" J. Vac. Sci. Tech. B10(2), 1992, 873–876 no month.
Biefeld et al. "Epitaxial growth of InSb on GaAs by Metalorganic Chemical Vapor Deposition" Appl. Phy. Lett. 57(15), 1990, 1562–1565.
Evans et al., "Molecular-beam Epitaxial Growth and Characterization . . . " J. Vac. Sci. Technol. B 10(2), Mar./Apr. 1992 pp. 870–872.
Munekata et al., "Epitaxy of III–V Diluted Magnetic Semiconductor . . . "; J. Vac. Sci. Technol. B 8(2), Mar./Apr. 1990 pp. 176–180.
Uwai et al., "Growth of Erbium-Doped GaAs and InP by Metalorganic . . . "; Journal of Crystal Growth 93, (1988) pp. 583–588, month unknown.
Klein et al., "Photoluminescence and Magnetic Resonance Studies of . . . "; Appl. Phys. Lett. 58(5), Feb. 4, 1991 pp. 502–504.
Isshiki et al., "Impact Excitation of the Erbium-Related 1.54 μm . . . "; Appl. Phys. Lett. 58(5), Feb. 4, 1991 pp. 484–486.
Allen, et al., "ErAs Epitaxial Layers Buried in GaAs: . . . "; Phys. Rev. Lett 62(19), May 8 1989 pp. 2309–2312.
Partin, "Lead Salt Quantum Effect Structures"; IEEE Journal of Quantum Electronics 24(8), Aug. 1988 pp. 1716–1726.

*Primary Examiner*—Olik Chaudhuri
*Assistant Examiner*—Ramamohau Rao Paladugu
*Attorney, Agent, or Firm*—Robert J. Wallace

[57] ABSTRACT

A semiconductor film is provided characterized by having high carrier mobility and carrier density. The semiconductor film is doped with the rare-earth element erbium so as to improve its temperature stability. The semiconductor film is thereby particularly suited for use as a magnetic field sensing device, such as a Hall effect sensor or magnetoresistor. The semiconductor film is formed from a narrow-gap Group III-V compound, preferably indium antimonide, which is n-doped with the erbium to provide an electron density sufficient to increase temperature stability. In particular, the semiconductor film is characterized by a nini-structure which is generated using a slab-doping technique. The slab-doping process encompasses the growing of alternating layers of doped and undoped layers of the Group III-V compound, with the doped layers being substantially thinner than the undoped layers, and preferably as thin as one atomic plane. The electron density establishes an average extrinsic electron density within the combined undoped and doped layers of the Group III-V compound. The density of erbium in the doped layers is preferably sufficient to yield an average extrinsic electron density of between about $1 \times 10^{16}$ cm$^{-3}$ and about $1 \times 10^{18}$ cm$^{-3}$, while also achieving a carrier mobility greater than about 30,000 cm$^{-2}$/V-s at room temperature.

14 Claims, 1 Drawing Sheet

RARE EARTH SLAB DOPING OF GROUP III-V COMPOUNDS

The present invention generally relates to doping of semiconductor materials for purposes of influencing carrier mobility and density. More particularly, this invention relates to the doping of Group III-V compounds with a rare-earth element, wherein the resulting doped semiconductor film is characterized by a high carrier density and improved carrier mobility, such that the semiconductor film is suitable for use as a magnetic field sensing device.

BACKGROUND OF THE INVENTION

To be suitable for use as magnetic field sensors such as Hall sensors and magnetoresistors, it is well known that semiconductors and semiconductor films must have a sufficiently high electron mobility to provide good sensitivity to a magnetic field. It is also well known that such semiconductor devices must simultaneously have a sufficiently high electron density to obtain good temperature stability, so that sensor output is in response to changes in the immediate magnetic field and not in response to changes in temperature.

Electron density can be improved by homogeneously doping the semiconductor material with properly selected elements to increase the number of free electrons in the semiconductor material. These doping impurities serve as either donors or acceptors to the semiconductor compound to provide free carriers, in the form of electrons or holes, respectively, by which current may be conducted through the semiconductor. However, increased dopant density also inherently results in increased scattering of the free carriers, and thereby reduces the sensitivity of the magnetic field sensing device by decreasing the scatter-free length of an electron's path through the semiconductor. Accordingly, attempting to improve electron density by doping the semiconductor material is often self-defeating in that electron mobility is effectively reduced due to scattering on dopant impurities. Thus, a compromise must often be made between optimizing the carrier mobility and the carrier density within the operating temperature range of the device.

An alternate approach to the above homogeneous-doping method is referred to as slab-doping, which entails growing a thin layer of doped semiconductor material which interfaces with an undoped semiconductor layer. The electrons or holes released from the impurities in the doped layer diffuse into the undoped layer of the semiconductor film where they will have higher mobilities than in the doped layer due to lower dopant density. The intent is that the mobility of the semiconductor film, averaged over the doped and the undoped layers, will be higher than that of a homogeneously doped semiconductor film with the same average impurity concentration. Using this approach, multiple layers of doped material can be alternated with layers of undoped, or intrinsic, material.

There are a number of parameters that can be adjusted to obtain the desired improved average mobility in a slab doped semiconductor film, including doped layer thickness, impurity concentration in the doped layer, the number of alternating doped layers, and the thickness of the intrinsic layer between doped layers. Where the resulting semiconductor film has a slab-doping profile that consists of multiple alternating layers of heavily doped n-type material and intrinsic material, the structure is commonly referred to as a "nini"-structure. Where the thickness of each n-type doped layer in a nini-structure is limited to a single atom plane, the slab-doping process is referred to as "δ-doping."

A major difficulty with all slab-doping techniques is that the presence of the doped layer electrostatically distorts the conduction and valence band edges in the intrinsic material near the doped layer, such that electrons are attracted to the positively charged donor ions, thereby reducing the mobility of the electrons. This effect is due to the attractive Coulomb potential V which the ionized impurities impose upon the free electron carriers. The energy bands then bend by an amount $qV$, where $q$ is the electron charge. The Coulomb potential is always attractive since the ionized impurity has an opposite charge to that of the free carrier, whether an electron or hole, which it has released. The bending of the bands always tends to form a Coulomb potential well around the impurity. In a randomly doped sample, the Coulomb potentials around each impurity tend to average out over the whole sample, leaving only a small ripple in the semiconductor band edges. This ripple affects transport properties only at very low temperatures below 1K and in very high magnetic fields of about 10 tesla or greater.

However, in a δ-doped sample there is a large density of charged impurities in one atomic plane. The Coulomb potential well is then very deep and can completely confine the electrons of the impurity, preventing it from serving as a donor or acceptor. Even if the Coulomb potential well does not confine every electron, it will confine a substantial fraction of the total electron density close to the impurity-containing layer, reducing the average carrier mobility by reducing the probability that the electrons diffuse into the undoped, or intrinsic, semiconductor layer.

Other negative influences on electron mobility include film defects (dislocations and boundaries) and spin-disorder scattering. Film defects include the boundary effects of the interface between the film and the substrate or air and dislocations which result mostly from lattice mismatch between the film and the substrate. Spin-disorder scattering of the free electrons occurs when a dopant atom exhibits a magnetic moment as a result of having an unpaired electron in its outer shell. As a result, the path of an electron through the semiconductor is altered when it passes near such a dopant atom, thus decreasing the overall carrier mobility of the semiconductor by making the path of the electron through the semiconductor irregular. As an example, rare-earth elements are known to exhibit such a magnetic moment, causing spin disorder scattering of electrons which reduces the carrier mobility in the semiconductor.

In the prior art, the rare-earth elements europium and ytterbium, are known to have been added to narrow-gap (i.e. a narrow band gap between the valence and conduction bands on the order of 0.1 to 0.3 eV) Group IV-VI semiconductors to increase the energy band gap of the semiconductor material. A number of other rare-earth elements such as dysprosium, holmium, erbium and gadolinium are known to have been added to such narrow-gap Group IV-VI semiconductors to dope these semiconductors to n-type conductivity. Also, rare-earth elements have been added to large-gap III-V compounds (i.e. a band gap between the valence and conduction bands on the order of 1.4 eV) to create additional energy levels in the band gap of the semiconductor material when used as a dopant. Both of these uses of rare-earth dopants are directed toward optoelectronic devices and not magnetic field sensing devices.

Doping a semiconductor with rare-earth atoms can be advantageous in that the magnetic effects of a single atom can be studied even in relatively concentrated alloys. The 4f wavefunctions are extremely local in nature such that there is virtually no overlap with the 4f wavefunctions of the nearest neighbor. However, rare-earth atoms can reside on different sites of the host crystal lattice, which complicates the interpretation of the observed effects. Furthermore, there could be interactions between rare-earth atoms affected by the conduction electrons of the semiconductor. Accordingly, the effect of rare-earth atoms on a semiconductor material is often unpredictable.

With reference again to electron mobility and density in a semiconductor film, the above discussion is particularly applicable to indium antimonide (InSb), a narrow-gap Group III-V compound which is often the preferred semiconductor compound for magnetic field sensor devices. This is because InSb has, among all binary compounds, the highest electron mobility at room temperature. InSb also has a very low energy band gap (approximately 0.18 eV) between its valence and conduction bands. Unfortunately, this energy band gap is sufficiently small to enable electrons to readily jump from the valence band to the conduction band when exposed to modest increases in temperature, making the electron density in the conduction band of InSb sensitive to temperatures near and above room temperature. Accordingly, InSb films must be doped to improve their temperature stability. However, improvements in temperature stability with previous attempts at doping InSb, such as nini-doping with silicon, have resulted in impaired electron mobility.

Thus, it would be desirable to provide a dopant which induces a high carrier density in an InSb semiconductor film to improve its temperature stability while also obtaining a high carrier mobility of the film so as to enable its use as a magnetic field sensing device.

SUMMARY OF THE INVENTION

It is an object of this invention to provide a semiconductor film having a high carrier mobility while also being substantially insensitive to temperatures changes, such that the semiconductor film is suitable for use as a magnetic field sensing device.

It is a further object of this invention to provide a dopant for increasing the carrier density of an indium antimonide semiconductor film while maintaining a suitably high carrier mobility in the semiconductor film.

Lastly, it is still a further object of this invention that such a dopant be a rare earth element which, when doped to form nini-doped and particularly δ-doped structures, is capable of improving the carrier mobility of the semiconductor film.

In accordance with a preferred embodiment of this invention, these and other objects and advantages are accomplished as follows.

According to the present invention, there is provided a semiconductor film characterized by having a high carrier mobility and which is doped with the rare-earth element erbium so as to improve the semiconductor's temperature stability. The semiconductor is thereby particularly suited for use as a magnetic field sensing device, such as a Hall effect sensor or magnetoresistor. The semiconductor film is formed from the narrow-gap Group III-V compound indium antimonide which is n-doped with erbium to provide a predetermined electron density sufficient to increase temperature stability.

In a preferred embodiment, the semiconductor film is characterized by a δ-structure which is generated using a slap-doping technique. The slab-doping process encompasses the growing of alternating layers of doped and undoped layers of the Group III-V compound, with the doped layers preferably having a thickness of one atomic plane, and being substantially thinner than the undoped layers. The predetermined electron density establishes an average extrinsic electron density within the combined undoped and doped layers of the Group III-V compound. The predetermined density of erbium in the doped layers is preferably sufficient to yield an average extrinsic electron density of between about $1 \times 10^{15}$ cm$^{-3}$ and about $1 \times 10^{17}$ cm$^{-3}$, while also achieving a carrier mobility substantially greater than about 30,000 cm$^2$/V-s at room temperature (about 25° C).

The fabrication process also includes providing an insulating substrate on which the indium antimonide film is grown. The indium antimonide film is grown using known Molecular Beam Epitaxy methods, though it is entirely foreseeable that metalorganic Chemical Vapor Deposition (MOCVD) methods as well as others could also be used. An undoped layer of indium antimonide is first epitaxially grown on the insulating substrate, followed by the epitaxial growth of a doped indium antimonide layer. The second indium antimonide layer is doped with erbium to a predetermined electron density so as to establish an average extrinsic electron density of between about $1 \times 10^{15}$ cm$^{-3}$ and about $1 \times 10^{17}$ cm$^{-3}$ in the doped indium antimonide films.

Using this fabrication procedure, the semiconductor film exhibited improved carrier mobility of free electrons and a higher average electron density as a result of the erbium contributing electrons to the existing intrinsic electrons provided by the InSb. Correspondingly, the increase in electron density provided enabled the resistivity of the semiconductor film to be substantially temperature independent over a range of about 40 to 400K. As a result, the methods of the present invention provided a semiconductor film with sufficient carrier mobility so as to be very sensitive to magnetic field changes while also being substantially insensitive to temperature.

The fabrication method of this invention provides unexpected results in terms of the improved carrier mobility and density characteristics as compared to homogeneously-doped semiconductor films, a low doping efficiency (the number of dopant atoms required to donate one electron) of the rare-earth element, and an actual increase in carrier mobility while simultaneously increasing the average carrier density within the semiconductor film at cryogenic temperatures. With this increase in the carrier mobility, the devices made from semiconductor films doped with higher erbium concentrations are even more sensitive to changes in the magnetic field than those made from material doped at lower erbium concentrations.

The above results were practically unforeseeable given the known nature of erbium. First, erbium is trivalent, leading one to believe that erbium would simply substitute for indium so as to be electrically inactive, or substitute for antimonide so as to behave as an acceptor.

Thus, the fact that the erbium atoms contributed any electrons to the quantity of free electrons was unexpected. Secondly, the mobility of the semiconductor film actually increased with an increase in electron density, which is contrary to what would naturally be expected in that increased electron scattering is the norm when increasing electron density, which generally leads to a lower electron mobility. Moreover, the use of erbium is associated with spin-disorder scattering, which would be expected to further reduce the electron mobility in the semiconductor. Finally, it unexplainably appears that electron mobility is rather independent of temperature. To the contrary, electron mobility actually increases up to doping levels which yield extrinsic electron densities of about $1 \times 10^{17}$ cm$^{-3}$.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing wherein.

DETAILED DESCRIPTION OF THE INVENTION

Figure 1:
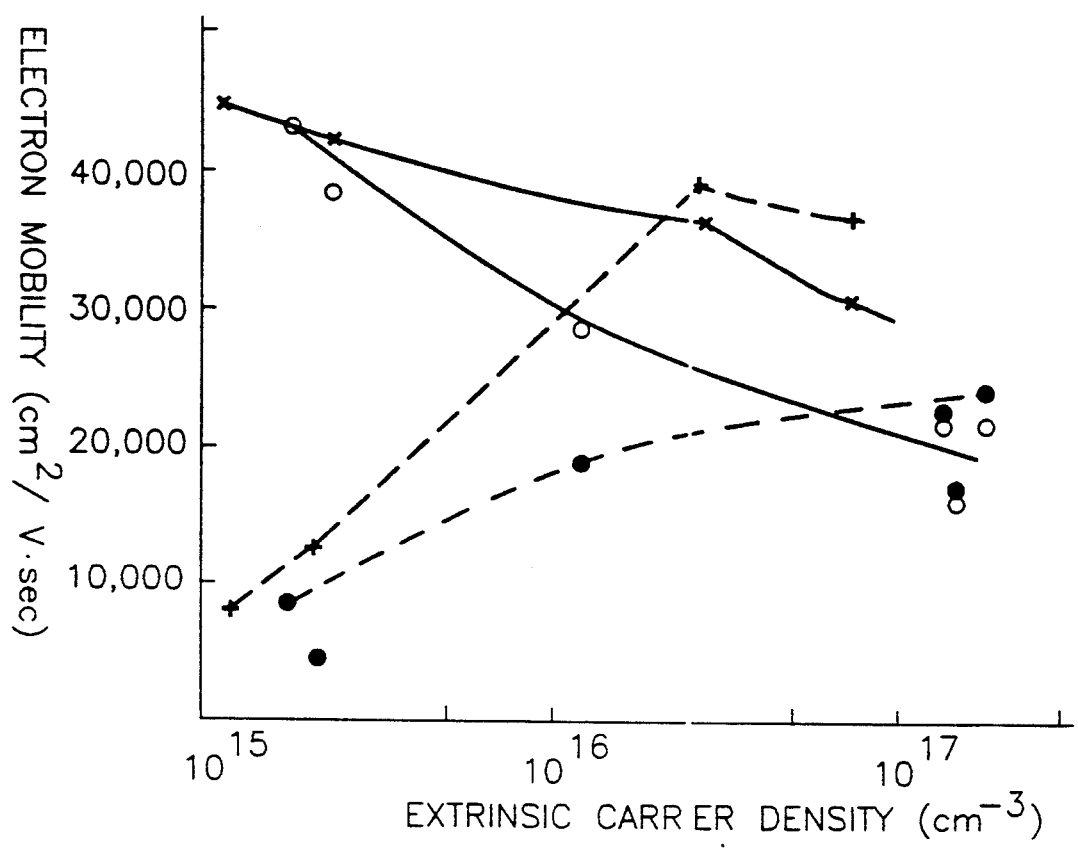
FIG. 1 shows, in graphical form, electron mobility as a function of the extrinsic carrier density for a slab-doped indium antimonide semiconductor film prepared in accordance with this invention.

A means for improving the electron density in an indium antimonide (InSb) semiconductor film with minimal decrease in its electron mobility is provided by appropriately doping the InSb with erbium in accordance with the method of this invention. By improving the electron density in the InSb compound, the semiconductor film becomes more temperature stable so as to be more proficient as a magnetic field sensing device. Though an InSb semiconductor film and an erbium dopant are specifically described herein, it is believed that the teachings of the present invention are also applicable to doping other narrow-gap Group III-V compounds with other rare-earth elements.

As previously noted, rare-earth elements such as erbium have found previous use as means for altering a semiconductor film to get an optically active material. As an example, rare-earth elements such as europium and ytterbium have been added to narrow-gap Group IV-VI semiconductor films to increase the energy band gap of the semiconductor material, and elements such as erbium have been added to large-gap III-V compounds to introduce an optically active energy level in the band gap of the semiconductor material. However, rare-earths have not been used as dopants for magnetic field sensing semiconductor films to increase electron density or mobility because rare-earth elements are known to exhibit a magnetic moment which causes spin disorder scattering of electrons, thereby reducing the carrier mobility of the semiconductor. However, with the teachings of the present invention there is disclosed a phenomenon not previously known or described, in which a rare-earth element serves to n-dope a Group III-V compound for the purpose of improving the compound's magnetoresistance characteristics.

The InSb semiconductor film of the present invention is characterized as being formed using known slab-doping techniques with molecular Beam Epitaxy methods to grow alternating layers of doped and undoped InSb films on an insulating substrate, such as indium phosphide (InP). In the preferred embodiment, the first InSb layer is undoped and is grown on the InP insulating substrate to a thickness of about 0.4 μm. Thereafter, the remainder of the InSb semiconductor film is grown with doped InSb layers alternated with undoped InSb layers to form nini-doped profiles. A δ-doped nini-structure is the preferred embodiment of the invention.

With the semiconductor film described above, it has been unexpectedly discovered that the density of electrons in the InSb semiconductor film is dependent upon the doping level of the erbium atoms. Generally, there is an intrinsic number of electrons available from the InSb. In addition, there is a number of extrinsic electrons available which result from miscellaneous impurities being present in both the InSb compound and the doping atmosphere. Finally, there are extrinsic electrons contributed by the erbium atoms. Test results described below for both doping techniques indicated that approximately 1 electron was contributed for every 30 erbium atoms.

For evaluation, erbium-doped semiconductor films were grown at 300° C. and compared to an undoped InSb semiconductor film for electron mobility and density. Table 1 below details comparative tests conducted between an undoped InSb sample (Sample #1), InSb films homogeneously doped with erbium concentrations varying between about $4.3 \times 10^{16}$ cm$^{-3}$ and about $1.1 \times 10^{19}$ cm$^{-3}$ (Samples #2 through 9), nini-doped InSb films (Samples #10 and 11), and the δ-doped InSb films of the preferred embodiment (Samples #12 through 15). The details of the doping profile of each film sample—i.e. the number of doped slabs, the thickness of the intrinsic material between each doped layer, and the erbium density in each doped layer—is also given.

TABLE I.

| Sample No. | $N_{Er}$ (cm$^{-3}$) | T (Å) | No. Doped Layers | $N_{Er}$ per Layer (cm$^{-3}$) | 73K | | 310K | |
|---|---|---|---|---|---|---|---|---|
| | | | | | n (cm$^{-3}$) | μ (cm$^2$/V-s) | n (cm$^{-3}$) | μ (cm$^2$/V-s) |
| 1 | 0 | 20,200 | 0 | 0 | 9.16E14 | 68,000 | 2.26E16 | 52,204 |
| Homogeneous-doped samples: | | | | | | | | |
| 2 | 4.3E16 | 19,600 | 1 | 4.3E16 | 2.75E15 | 8,574 | 2.04E16 | 42,875 |
| 3 | 1.1E17 | 20,100 | 1 | 1.1E17 | 3.20E15 | 4,053 | 1.82E16 | 38,123 |
| 4 | 2.5E17 | 20,100 | 1 | 2.5E17 | 1.39E16 | 31,766 | 3.34E16 | 39,820 |
| 5 | 4.5E17 | 20,100 | 1 | 4.5E17 | 1.23E16 | 18,891 | 3.08E16 | 28,757 |
| 6 | 2.5E18 | 20,100 | 1 | 2.5E18 | 1.44E17 | 22,135 | 1.62E17 | 21,795 |
| 7 | 8.4E18 | 20,800 | 1 | 8.4E18 | 1.79E17 | 24,757 | 2.37E17 | 21,775 |
| 8 | 1.1E19 | 20,100 | 1 | 1.1E19 | 1.49E17 | 17,430 | 1.92E17 | 17,945 |
| 9 | 8.0E18 | 20,000 | 1 | 8.0E18 | 4.89E16 | 22,565 | 7.87E16 | 21,508 |

TABLE I.-continued

| Sample No. | $N_{Er}$ (cm$^{-3}$) | T (Å) | No. Doped Layers | $N_{Er}$ per Layer (cm$^{-3}$) | 73K n (cm$^{-3}$) | 73K μ (cm$^2$/V-s) | 310K n (cm$^{-3}$) | 310K μ (cm$^2$/V-s) |
|---|---|---|---|---|---|---|---|---|
| *Nini-doped samples:* | | | | | | | | |
| 10 | 1.6E16 | 50/1260 | 12 | 5.3E17 | 2.17E15 | 7,930 | 2.18E16 | 44,553 |
| 11 | 3.5E16 | 40/2200 | 7 | 2.5E18 | 3.16E15 | 12,834 | 2.22E16 | 42,493 |
| *δ-doped samples: (cm$^{-2}$)* | | | | | | | | |
| 12 | 6.0E17 | δ/1300 | 12 | 1.0E13 | 2.34E16 | 38,038 | 4.52E16 | 36,300 |
| 13 | 4.7E17 | δ/5000 | 2 | 4.7E14 | 1.74E15 | 15,452 | 2.32E16 | 40,250 |
| 14 | 1.2E18 | δ/650 | 24 | 1.0E13 | 2.86E16 | 38,863 | 4.69E16 | 36,557 |
| 15 | 2.4E18 | δ/3258 | 48 | 1.0E13 | 8.06E16 | 36,600 | 1.10E17 | 31,000 |

In reference to the above table, the erbium concentration $N_{Er}$ (in cm$^{-3}$) is an average value of all of the semiconductor layers for the nini- and δ-doped samples (Samples #10 through 15); T is the thickness (in Angstroms) of the doped semiconductor layer for homogeneously-doped samples (Samples #2 through 9) and the thicknesses of the doped layer/spacer (undoped) layers for the nini- and δ-doped samples (Samples #10 through 15); the erbium concentration $N_{Er}$ per layer is in cm$^{-3}$ for the homogenous-doped samples (Samples #2 through 9) and the two nini-doped samples (Samples #10 and 11), and in cm$^{-2}$ for the δ-doped samples (Samples #12 through 15) due to δ-doped layers being a single atom plane; n (in cm$^{-3}$) is the concentration of free electrons (both intrinsic and extrinsic) in the semiconductor at 73K and 310K; and μ is the electron mobility value (in cm$^2$/V-s) in the semiconductor at 73 and 310K.

For analysis, the galvanomagnetic properties of a sample of each film were measured over the temperature range of about 40K to about 400K in magnetic fields ranging from 0 to about 2 tesla. The samples were photolithographically defined six-probe Hall patterns of the kind known to the prior art. The measurements were made in a closed-cycle refrigerator using a conventional DC technique. The signs of the current and of the magnetic field were reversed, and the longitudinal ($\rho_{xx}$) and Hall ($\rho_{xy}$) resistivities were calculated from the average readings.

Sample #9, grown at 350° C. with $8.0 \times 10^{18}$ cm$^{-3}$ Er, was also mounted in a liquid helium cryostat and measured at 4.2K at fields up to 7 tesla. An oscillatory component (Shubnikov-de Haas oscillations) was observed in the magnetoresistance. The period of these oscillations provided information regarding the electron density and the band structure of the film. The density of electrons obtained from the Hall measurements agreed well with the period of the Shubnikov-de Haas oscillations, given the effective mass and the energy gap of pure InSb. This indicated that erbium concentrations up to that limit do not significantly affect the band structure. Whereas almost all of our growths of erbium-doped InSb were done at a temperature of 300° C., there was very limited evidence that growth done at higher temperatures, such as 350° C., gave films with higher electron mobilities, and those grown below 300° gave films with lower electron mobilities. This preliminary finding needs further study.

The resistivity $\rho_{xx}$ of most samples was magnetic field dependent. The Hall resistivity $\rho_{xy}$ of most samples was not simply proportional to the magnetic field. These observations indicated that more than one type of electron was present in the films studied. For each film and at each temperature studied, the data was analyzed using a two-carrier model. In all films there was detected a density of about 1 to $5 \times 10^{16}$ cm$^{-3}$ of low mobility electrons—i.e. electrons with a mobility μ of less than about 7000 cm$^2$/V-s. Neither the density nor the mobility of these electrons was very temperature dependent. It was presumed that these electrons were mostly located near the film-substrate interface of each InSb film, where electron mobility is low due to the presence of many dislocations induced by the lattice mismatch between InSb film and the InP substrate.

The resistivities $\rho_{xx}$ and $\rho_{xy}$ were dominated by the properties of the high-mobility electrons observed in the films. Their densities n and mobilities μ at 73K and at 310K are summarized in the table above. The density n did not vary much between about 40K and 150K for any sample other than the undoped sample (Sample #1). At 73K the density of extrinsic electrons, due to the erbium doping, was much larger than the intrinsic density of the individual samples. Moreover, the density of extrinsic electrons was even greater than the density measured on the pure Sample #1, in which some electrons at low temperatures may have been due to doping by residual impurities in the Molecular Beam Epitaxy system or in the InSb and InP materials.

For each doped film, the density of electrons induced by the presence of erbium can be calculated by: n (at 73K) minus n for Sample #1 ($9.16 \times 10^{14}$ cm$^{-3}$). The density of electrons at higher temperatures can roughly be interpreted as being the sum of these extrinsic electrons and the intrinsic electrons as measured on film #1. From these results, average erbium atom densities of between about $1.6 \times 10^{16}$ cm$^{-3}$ and about $1.2 \times 10^{18}$ cm$^{-3}$ in the nini-doped semiconductor films resulted in average extrinsic electron densities of between about $2.1 \times 10^{15}$ cm$^{-3}$ and about $2.8 \times 10^{16}$ cm$^{-3}$, and electron mobility of between about 7930 cm$^2$/V-s and about 38,863 cm$^2$/V-s at 73K. At 310K, these same erbium atom densities resulted in electron mobility of between about 36,300 cm$^2$/V-s and about 44,553 cm$^2$/V-s.

FIG. 1 illustrates the mobility of electrons at both 73K and 310K as a function of extrinsic electron concentration at 73K. The electron density at 73K was used in order to keep emphasis on the activity of the erbium atoms. The mobility is shown for both the homogeneously-doped and nini-structure and δ-doped nini-structure InSb films. The nini-structure (Samples #10 and 11) and δ-doped samples (Samples #14 and 15) are represented by "+" at 73K and "x" at 310K, while the homogeneously-doped samples (Samples #2, 3, 5, 6, 7 and 8) are represented by a solid bullet at 73K and a hollow bullet at 310K. FIG. 1 graphically indicates that the mobility at both temperatures is much higher in the nini-structure samples than in the homogeneously-doped samples for same carrier concentrations. Though the mobilities of Sample #15 were not as good as the other nini-structure samples, they were still much better than those of the homogeneously-doped samples. Noting that the doping efficiency of erbium was the same for both doping techniques, it was concluded that the mobility of doped InSb can be successfully enhanced by δ-doped nini structures, provided erbium is the dopant.

Figure 2:
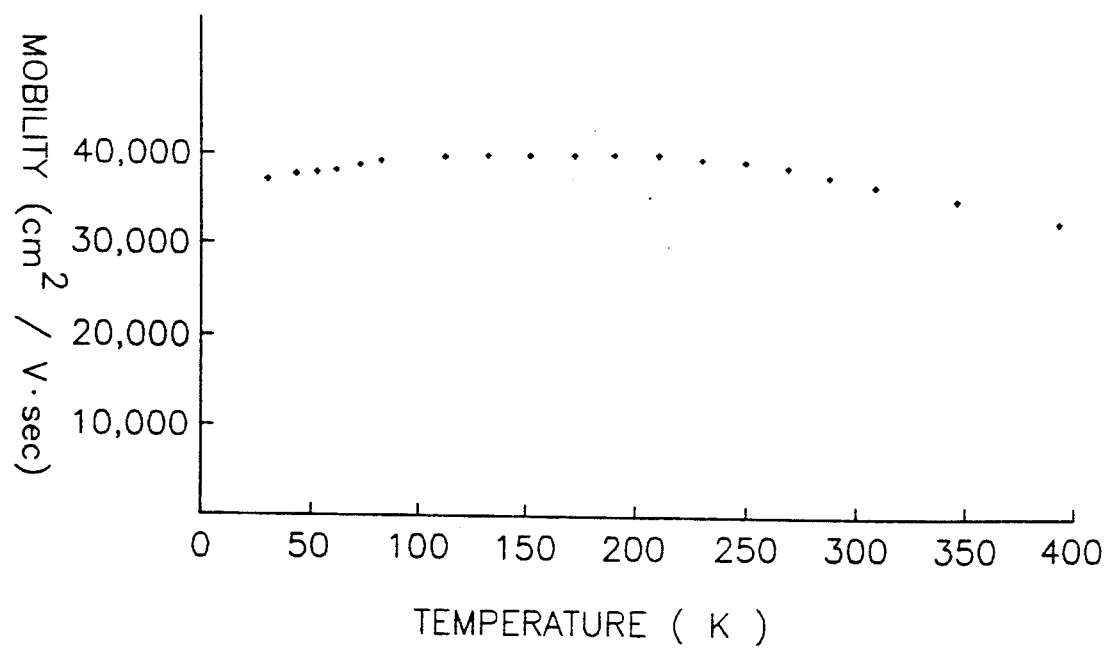
FIG. 2 shows, in graphical form, the temperature dependence of the electron mobility as a function of temperature for the slab-doped indium antimonide semiconductor film prepared in accordance with this invention.

FIG. 2 shows the temperature dependence of the electron mobility μ for the δ-doped structure of Sample #14, the highest mobility obtained for a nini-doped sample. As can be readily seen, the mobility was rather temperature independent in the δ-doped structure. This is a highly unusual characteristic for a high-mobility semiconductor such as InSb.

The results described above for the preferred slab- or nini-doping technique were unexpected in other ways. First, the doping efficiency—i.e. the number of dopant atoms required to donate one electron—of erbium was very low, on the order of one electron for every 30 erbium atoms. In that erbium is trivalent in the f-band, erbium would normally be expected to simply substitute for indium so as to be electrically inactive or substitute for antimonide so as to behave as an acceptor. Thus, the fact that the erbium atoms actually donated any electrons to the quantity of free electrons was completely unexpected.

Second, that increased concentrations of erbium and carriers at 73K resulted in an increase in carrier mobility in both the homogeneously-doped and nini-doped samples could not be explained. The implication is that the more impurity atoms present the better the electron mobility, a contradiction to doping phenomena previously known. In addition, the fact that the δ-doped nini structure samples exhibited significantly better electron mobility than the homogeneously-doped samples at 310K is not fully understood. A partial explanation may be that the impurities in the δ-doped samples are located in a single plane. Improved mobility is thereby possible because there is more order in the δ-doped structures—the impurity atoms are not randomly distributed throughout the crystal, but are layered. It is therefore more likely that electrons have fewer collisions with erbium atoms in δ-doped samples than in randomly doped samples.

Finally, electron mobility which is substantially temperature independent is highly unusual in high-mobility semiconductor films. As can be seen in the table, electron mobility was actually increased at erbium doping levels which yielded extrinsic electron densities of about $1 \times 10^{17}$ cm$^{-3}$. This relative temperature independence of the electron mobility may lead to unique applications. For example, magnetoresistors made from the erbium-doped InSb semiconductor film would have a magnetic field sensitivity that would not be very temperature dependent, even if the zero-field resistivity is temperature dependent.

Accordingly, as a result of the nini-doping technique described above, the semiconductor film exhibited improved carrier mobility and density with less dependence on temperature. The increase in electron density correspondingly enables the semiconductor film to be substantially temperature independent over a range of about 40 to 400K. As a result, the methods of the present invention provide a semiconductor film with sufficient carrier mobility so as to be very sensitive to magnetic field changes while also being substantially insensitive to temperature.

On the basis of the unexpected results obtained according to the teachings of the present invention, it is believed that similar results could be obtained with slab-doping techniques using other rare-earth elements, particularly samarium. Rare-earth elements could also be useful donors in nini-structures made of other semiconductor materials, most notably the Group IV elements (silicon, germanium, their alloys and superlattices, and SiC), III-V compounds (GaAs, InAs, GaSb or alloys thereof), II-VI compounds (HgTe, CdTe, HgSe, CdSe and alloys thereof) or IV-VI compounds (PbTe, PbSe, SnTe, SnSe or alloys thereof). In conjunction with known heterojunctions, slab or δ-doped layers of rare-earth elements could lead to improved mobilities in modulation doped structures of InSb or of the previously-noted semiconductor materials.

In addition, transition metals with d-band electrons could also conceivably give rise to similar effects when used as dopants in nini-structures, though d-band electrons tend to be less localized than f-band electrons. While it may be that the novel effects observed are based upon erbium's f-band energy levels, it is foreseeable that the effects could be observed with d-band impurities. For example, other impurities with completely filled and/or empty bands, such as silicon in InSb, may give similar effects.

Therefore, while our invention has been described in terms of a preferred embodiment, it is apparent that other forms could be adopted by one skilled in the art. Accordingly, the scope of our invention is to be limited only by the following claims.

We claim:

1. A composition for use in a magnetic field sensing device, said composition comprising:
   a first semiconductor layer formed from a narrow-gap Group III-V compound and a contiguous doped layer of said Group III-V compound doped with a rare-earth element to a predetermined dopant density that establishes an average extrinsic electron density between said undoped and doped layers of said narrow gap Group III-V compound;
   wherein said composition is characterized by a high carrier mobility while having an enhanced extrinisic electron density so as to enable said high carrier mobility to be substantially temperature independent.

2. A composition as recited in claim 1 wherein said rare-earth element is erbium.

3. A composition as recited in claim 1 wherein said narrow-gap Group III-V compound is indium antimonide.

4. A composition as recited in claim 1 wherein said predetermined dopant density is a maximum of about $1 \times 10^{19}$ cm$^{-3}$.

5. A composition as recited in claim 1 wherein said narrow-gap Group III-V compound is doped n-type.

6. A composition as recited in claim 1 wherein said carrier mobility is greater than about 30,000 cm$^2$/V-s at about 25° C.

7. A composition for use in a magnetic field sensing device, said composition comprising:
   a first semiconductor layer formed from indium antimonide; and
   a second semiconductor layer deposited on said first semiconductor layer, formed from indium antimonide and doped with a rare-earth element to a predetermined dopant density;
   wherein said composition is characterized by having a high carrier mobility while having an enhanced average extrinsic electron density between said first and second semiconductor layers so as to enable said high carrier mobility to be substantially temperature independent.

8. A composition as recited in claim 7 wherein said rare-earth element is erbium.

9. A composition as recited in claim 7 wherein said average extrinsic electron density in said composition is a maximum of about $3 \times 10^{16}$ cm$^{-3}$ at 73K.

10. A composition as recited in claim 7 wherein said predetermined dopant density in said second semiconductor layer is at least about $5 \times 10^{17}$ cm$^{-3}$.

11. A composition as recited in claim 7 wherein said second semiconductor layer is approximately one atom plane thick and said predetermined dopant density in said second semiconductor layer is an areal density of at least about $1 \times 10^{13}$ cm$^{-2}$.

12. A composition for use in a magnetic field sensing device, said composition comprising:
    an insulator layer;
    a first semiconductor layer of indium antimonide epitaxially grown on said insulator layer; and
    a second semiconductor layer of indium antimonide epitaxially grown on said first semiconductor layer to a thickness of approximately one atomic plane, said second semiconductor layer being n-doped with erbium to a predetermined dopant density;
    wherein said composition is characterized by having a high carrier mobility while having an enhanced average extrinsic electron density between said first and second semiconductor layers so as to enable said high carrier mobility to be substantially temperature independent.

13. A composition as recited in claim 12 wherein said average extrinsic electron density in said first and second semiconductor layers is a maximum of about $3 \times 10^{16}$ cm$^{-3}$ at 73K.

14. A composition as recited in claim 12 wherein said predetermined dopant density in said second semiconductor layer is an areal density of at least about $1 \times 10^{13}$ cm$^{-2}$.

* * * * *